(12) United States Patent
Ihara

(10) Patent No.: US 7,176,507 B2
(45) Date of Patent: Feb. 13, 2007

(54) SOLID STATE IMAGE SENSING DEVICE AND METHOD OF MANUFACTURING THE SAME

(75) Inventor: Hisanori Ihara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/028,556

(22) Filed: Jan. 5, 2005

(65) Prior Publication Data

US 2005/0173742 A1    Aug. 11, 2005

(30) Foreign Application Priority Data

Jan. 20, 2004    (JP)    ............... 2004-011813

(51) Int. Cl.
    *H01L 27/146*    (2006.01)

(52) U.S. Cl. ............... 257/233; 257/292; 257/E27.146; 257/294

(58) Field of Classification Search ............... 257/292, 257/233, 431, 294, 290, 291; 438/48
See application file for complete search history.

(56) References Cited

U.S. PATENT DOCUMENTS 5,581,099 A * 12/1996 Kusaka et al. ............... 257/222
6,166,768 A    12/2000 Fossum et al.
6,521,925 B1 * 2/2003 Mori et al. ............... 257/292
6,599,772 B2    7/2003 Abe
2002/0008715 A1 * 1/2002 Sorek et al. ............... 345/698

FOREIGN PATENT DOCUMENTS

JP    2002-170945    6/2002

* cited by examiner

*Primary Examiner*—Douglas W. Owens
*Assistant Examiner*—Colleen Matthews
(74) *Attorney, Agent, or Firm*—Oblon, Spivak, McClelland, Maier & Neustadt, P.C.

(57) ABSTRACT

A solid state image sensing device comprises a first semiconductor region of first conductivity type, a second semiconductor region of second conductivity type provided in the first semiconductor region, a third semiconductor region of second conductivity type provided in the first semiconductor region with a space from the second semiconductor region, a gate electrode provided on the first semiconductor region between the second semiconductor region and the third semiconductor region, a gate insulator layer interposed between the first semiconductor region and the gate electrode, and a fourth semiconductor region of second conductivity type provided below the second semiconductor region in the first semiconductor region.

11 Claims, 11 Drawing Sheets

FIG. 11 PRIOR ART

SOLID STATE IMAGE SENSING DEVICE AND METHOD OF MANUFACTURING THE SAME

CROSS REFERENCE TO RELATED APPLICATION

This application is based upon and claims the benefit of priority from the prior Japanese Patent Application No. JP2004-11813 filed on Jan. 20, 2004, the entire contents of which are incorporated herein by reference.

FIELD OF THE INVENTION

The present invention relates to a solid state image sensing device which obtains a picture by a photoelectric conversion, and method of manufacturing the same, and more particularly relates to an MOS type solid state image sensing device and method of manufacturing the same.

DESCRIPTION OF THE BACKGROUND

As a solid state image sensing device, a CCD type solid state image sensing device and an MOS type solid state image sensing device are known. The MOS type solid state image sensing device can be driven by a single power supply, and an image pick-up section and a peripheral circuit can be manufactured in an MOS process to be constituted as one integrated circuit. In recent years, the MOS type solid state image sensing device attracts attention from these advantages. Moreover, the MOS type solid state image sensing device amplifies with a transistor a signal detected in a photoelectric-conversion section, and has a feature of being high sensitivity. Moreover, the MOS type solid state image sensing device is expected to be suitable for reduction of the pixel size by the increase in the number of pixels, or reduction of an image size.

Figure 10:
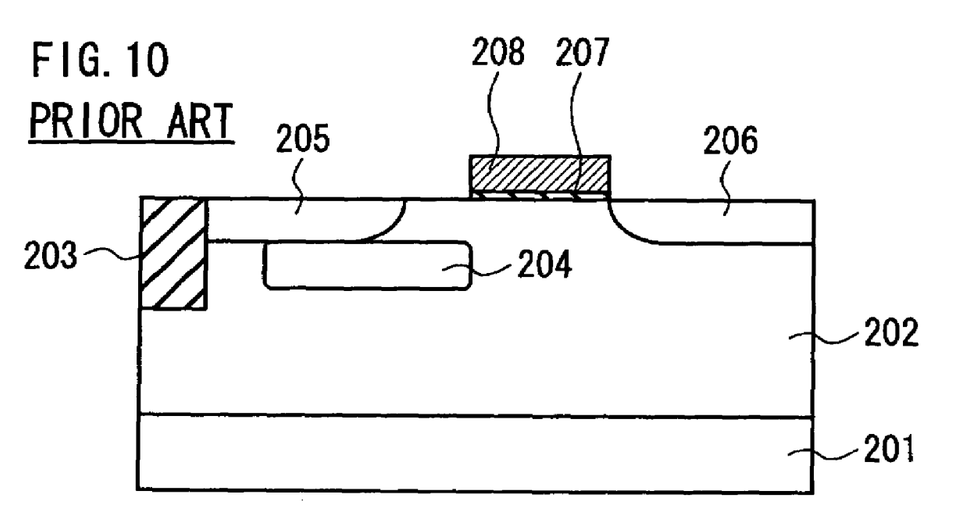
FIG. 10 is a cross-sectional view showing a region including a photodiode and a read-out transistor in the unit cell of the conventional solid state image sensing device.
Figure 11:
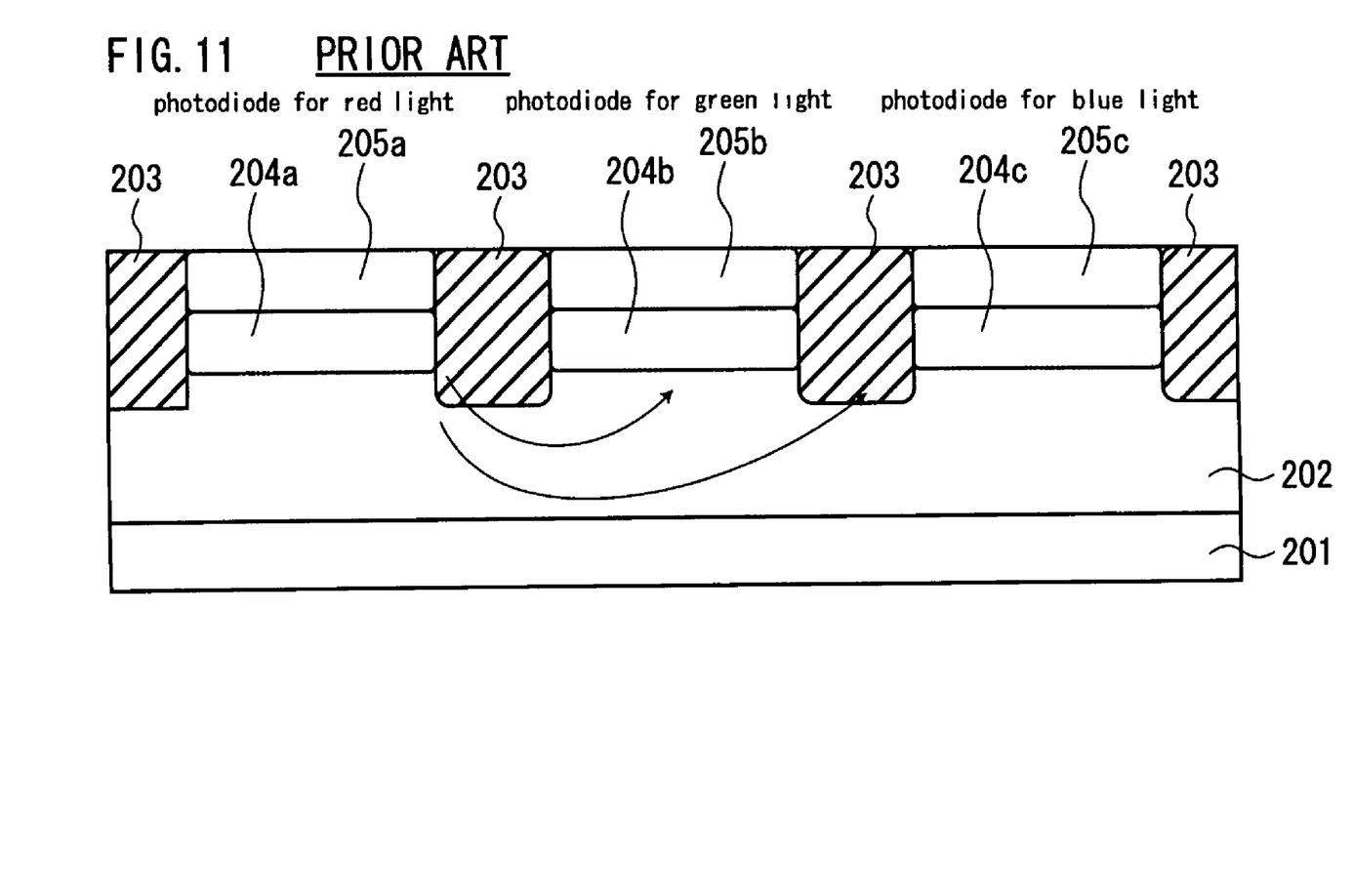
FIG. 11 is a cross-sectional structure showing signal accumulation regions and peripheral regions of three adjacent photodiodes in the conventional solid state image sensing device

With reference to FIGS. 10 and 11, description will be given of the conventional solid state image sensing device. A cross-sectional structure of a unit cell of the conventional solid state image sensing device is shown in FIG. 10. FIG. 10 is a cross-sectional view of a region including a photo-diode and a read-out transistor in the unit cell of the conventional solid state image sensing device. This conventional semiconductor device is described in Japanese Patent Publication (Kokai) No. PS61-26270.

A P-type well 202 is provided in an upper part of a P-type silicon substrate 201, and an isolation region 203 is provided in the P-type well 202. An N-type signal accumulation region 204 is provided in an upper part of the P-type well 202 with a space from an upper surface of the P-type well 202. Moreover, in the upper part of the P-type well 202, a P-type shield region 205 is provided between the upper surface of the P-type well 202 and the signal accumulation region 204. The photodiode of the unit cell includes the P-type well 202, the P-type barrier region 205 and the signal accumulation region 204. Moreover, a light filter (not shown) is provided over the P-type well 202, and faces the signal accumulation region 204. A spectral characteristic of the photodiode is dependant on a spectral characteristic of the light filter.

An N-type drain region 206 is provided in the upper part of the P-type well 202 with a space from the signal accumulation region 204. On the P-type well 202 between the signal accumulation region 204 and the N-type drain region 206, a gate electrode 208 is provided with a gate insulator layer 207 (not shown) interposed therebetween.

The signal accumulation regions and peripheral regions of three adjacent photodiodes in the conventional solid state image sensing device are shown in FIG. 11. First signal accumulation region 204a, second signal accumulation region 204b and third signal accumulation region 204c are provided in the upper part of the P-type well 202 with a space from each other. Moreover, first P-type shield region 205a, second P-type shield region 205b and third P-type shield region 205c are provided on the signal accumulation regions 204a, 204b and 204c in the upper part of the P-type well 202. The signal accumulation regions 204a, 204b and 204c are photodiodes, each of which has a different spectral characteristic with each other.

In a case where a color arrangement of a pixel by a photodiode is RGB color arrangement (Red, Green, Blue), first signal accumulation region 204a is a photodiode for red light, second signal accumulation region 204b is a photodiode for green light and third signal accumulation region 204c is a photodiode for blue light. An optical charge density generated by an incident light with longer wavelength (red>green>blue) is distributed over a deep position of the P-type well 202 because of an electrical property of the silicon substrate which is the P-type well 202.

In recent years, a distance between adjacent photodiodes is becoming short with reduction of pixel size. Therefore, in the above-mentioned conventional solid state image sensing device, it is possible that signal charge generated in a deep position of silicon substrate by an incident light with long wavelength (red) enter into a signal accumulation region of an adjacent photodiode as shown in the arrow of FIG. 11. Thus, when signal charge enter into the adjacent photodiode for green light and the adjacent photodiode for blue light from the photodiode for red light with long wavelength, an increase of a color mixture and a dark current has been seen as a problem.

SUMMARY OF THE INVENTION

One aspect of the present invention is to provide a solid state image sensing device that comprises a first semiconductor region of first conductivity type, a second semiconductor region of second conductivity type provided in the first semiconductor region, a third semiconductor region of second conductivity type provided in the first semiconductor region with a space from the second semiconductor region, a gate electrode provided on the first semiconductor region between the second semiconductor region and the third semiconductor region, a gate insulator layer interposed between the first semiconductor region and the gate electrode, and a fourth semiconductor region of second conductivity type provided below the second semiconductor region in the first semiconductor region.

DETAILED DESCRIPTION OF THE INVENTION

With reference to FIGS. 1 to 8, description will be given of an embodiment of a solid state image sensing device and a method of manufacturing the same.

Figure 1:
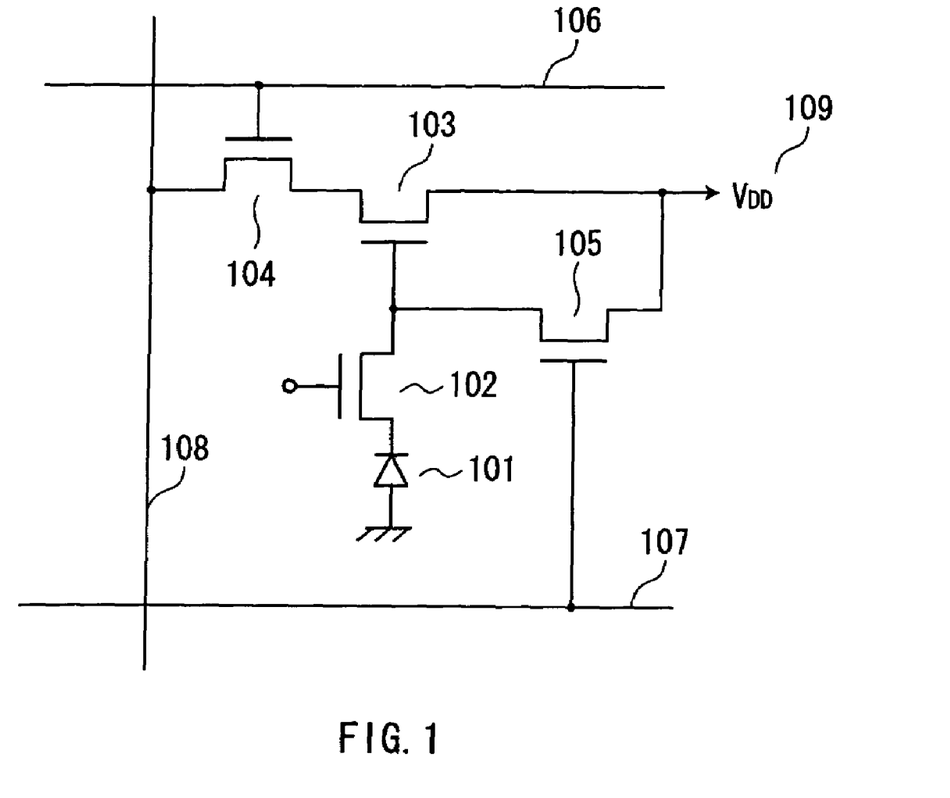
FIG. 1 is a circuit configuration of a unit cell of the solid state image sensing device according to the embodiment of the present invention.

First, with reference to FIG. 1, a circuit configuration of a unit cell of the solid state image sensing device according to the present embodiment will be described. FIG. 1 shows the circuit configuration of the unit cell of the solid state image sensing device according to the embodiment.

As shown in FIG. 1, the unit cell of the solid state image sensing device according to the embodiment includes a photodiode 101 which is a photoelectric-conversion section accumulating a signal, a read-out transistor 102 which is a signal scanning-circuit section reading the signal, an amplification transistor 103 which amplifies the signal, a perpendicular selection transistor 104 which chooses a line which reads the signal, and a reset transistor 105 which resets the signal charge of the photodiode 101.

By turning on a gate electrode (read-out gate electrode) of the read-out transistor 102, the signal of a photodiode 101 with which the signal charge is accumulated is read. A level address line 106 wired horizontally is connected to a gate electrode of the perpendicular selection transistor 104, and chooses the line which reads a signal. A reset address line 107 is connected to a gate electrode of the reset transistor 105. Moreover, a gate electrode of the amplification transistor 103 is connected to a drain of the read-out transistor 102, and a source of the amplification transistor 103 is connected to a drain of the perpendicular selection transistor 104. A source of the perpendicular selection transistor 104 is connected to a perpendicular signal line 108. A drain of the amplification transistor 103 is connected to a supply voltage VDD of a power supply 109. The supply voltage VDD of the power supply 109 is less than 2.8V. By arranging two or more such unit cells, a pixel array is constituted and the image pick-up area is constituted. In addition, a case where the pixel array is constituted by a RGB (Red, Green, Blue) pixel will be mentioned as an example.

Figure 2:
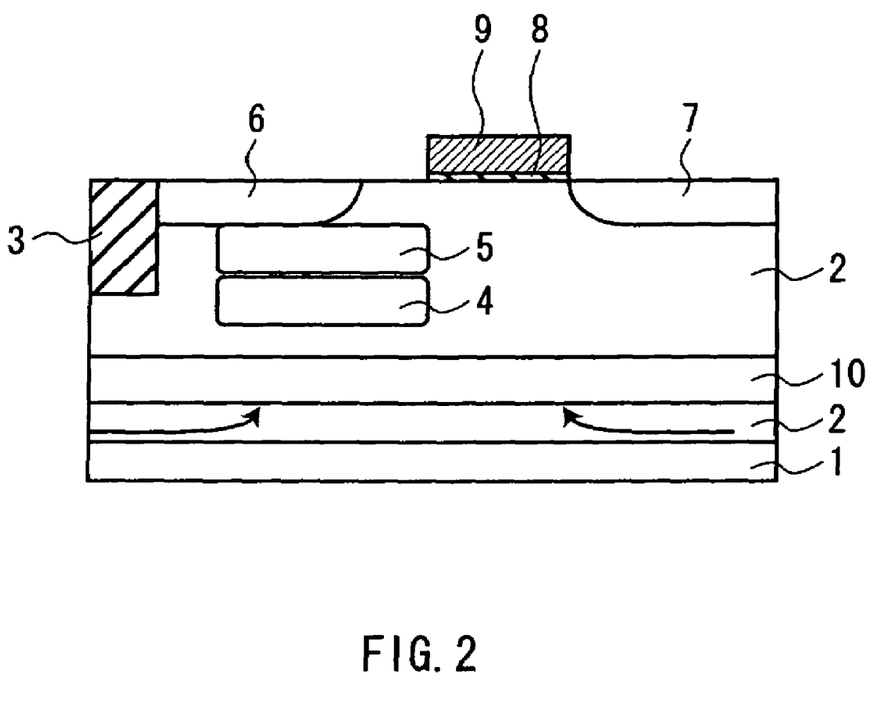
FIG. 2 is a cross-sectional view of a structure of the unit cell of the solid state image sensing device according to the embodiment of the present invention.

Next, with reference to FIG. 2, a cross-sectional structure of the unit cell of the solid state image sensing device according to the embodiment will be described. FIG. 2 is a cross-sectional view of a region including a photodiode 101 and a read-out transistor 102 in the unit cell of the solid state image sensing device according to the embodiment.

A P-type well 2 (first semiconductor region) is provided in an upper part of the P-type silicon substrate 1, and an isolation region 3 is provided in the P-type well 2. A P-type barrier region 4 (fifth semiconductor region) is provided in the upper part of P-type well 2 with a space from an upper surface of P-type well 2. Moreover, in the upper part of P-type well 2, An N-type signal accumulation region 5 (second semiconductor region) is provided between the upper surface of P-type well 2 and the P-type barrier region 4. Furthermore, in the upper part of P-type well 2, a P-type shield region 6 (sixth semiconductor region) is provided between the upper surface of the P-type well 2 and the signal accumulation region 5. The P-type shield region 6 is grounded by connecting with the isolation region 3. By this P-type shield region 6, a leakage current generated by disorder of the surface of the P-type well 2 (for example crystal defects) can be reduced. And the photodiode 101 of the unit cell includes the P-type well 2, the P-type barrier region 4, the signal accumulation region 5 and the P-type shield region 6. Moreover, a light filter (not shown) is provided above the P-type well 2, and faces the signal accumulation region 5. A spectral characteristic of the photodiode is dependant on a spectral characteristic of the light filter.

The N-type drain region 7 (third semiconductor region) is provided in the upper part of the P-type well 2 with a space from the signal accumulation region 5. Between the signal accumulation region 5 and the N-type drain region 7, a gate electrode 9 is provided on the P-type well 2 with the gate insulator layer 8 interposed therebetween. Moreover, in the P-type well 2, an N-type carrier absorption region 10 (fourth semiconductor region) is provided below the P-type barrier region 4 with a space from the P-type barrier region 4.

An impurity concentration of the P-type well 2 is about $1\times10^{14} \sim 1\times10^{18}$ cm$^{-3}$. An impurity concentration of the P-type barrier region 4 is high comparatively, and is higher than that of the P-type well 2 by about one figure. For example, the impurity concentration of the P-type barrier region 4 is about $1\times10^{15} \sim 1\times10^{19}$ cm$^{-3}$. Moreover, an impurity concentration of the signal accumulation region 5 is about $1\times10^{15} \sim 1\times10^{20}$ cm$^{-3}$. Furthermore, an impurity concentration of the P-type shield region 6 is higher than that of the signal accumulation region 5, and is about $1\times10^{16} \sim 1\times10^{21}$ cm$^{-3}$. Furthermore, an impurity concentration of the N-type carrier absorption region 10 is about $1\times10^{16} \sim 1\times10^{18}$ cm$^{-3}$.

Figure 3A:
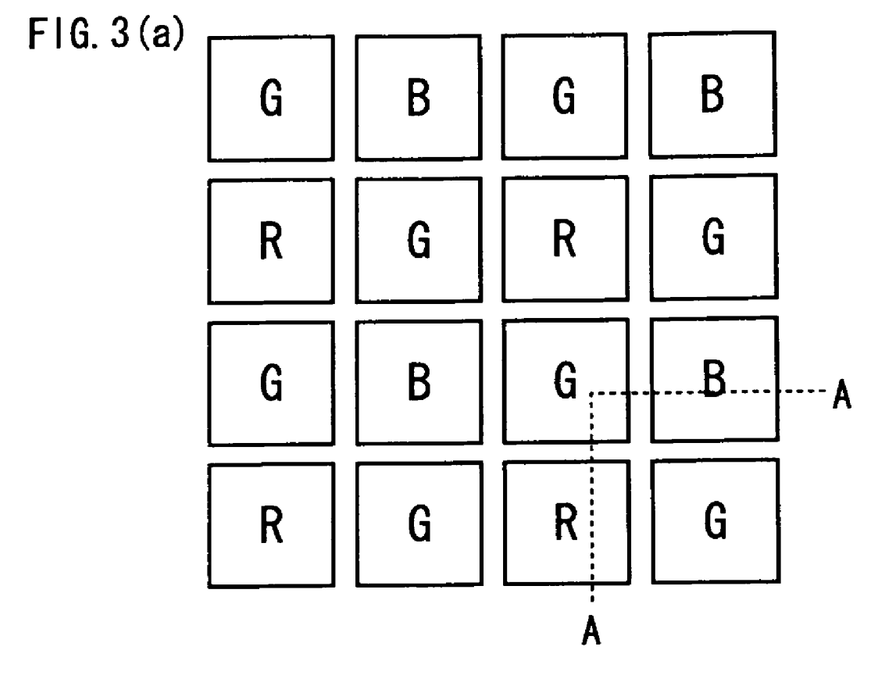
FIG. 3 is a diagram showing a color arrangement of a RGB pixel of the solid state image sensing device according to the embodiment of the present invention.
Figure 3B:
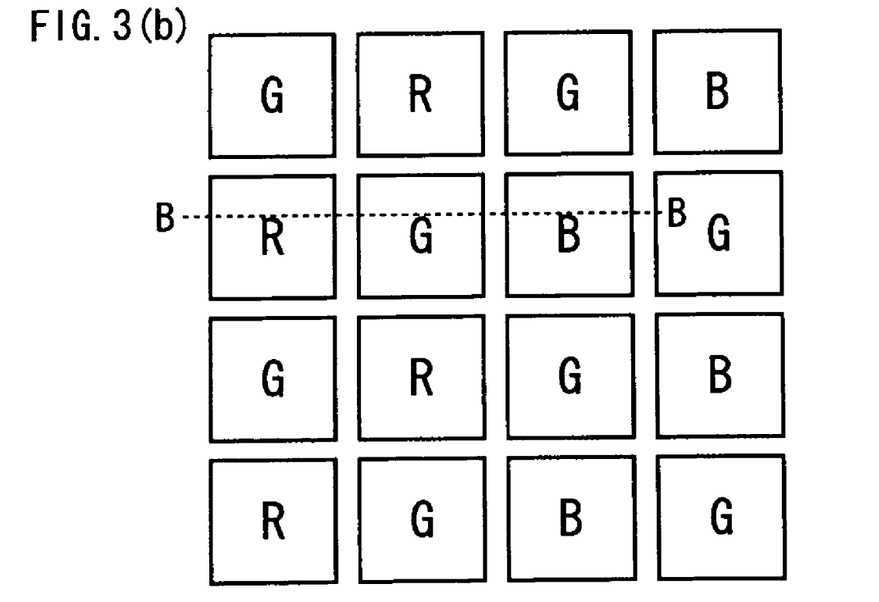
Figure 4:
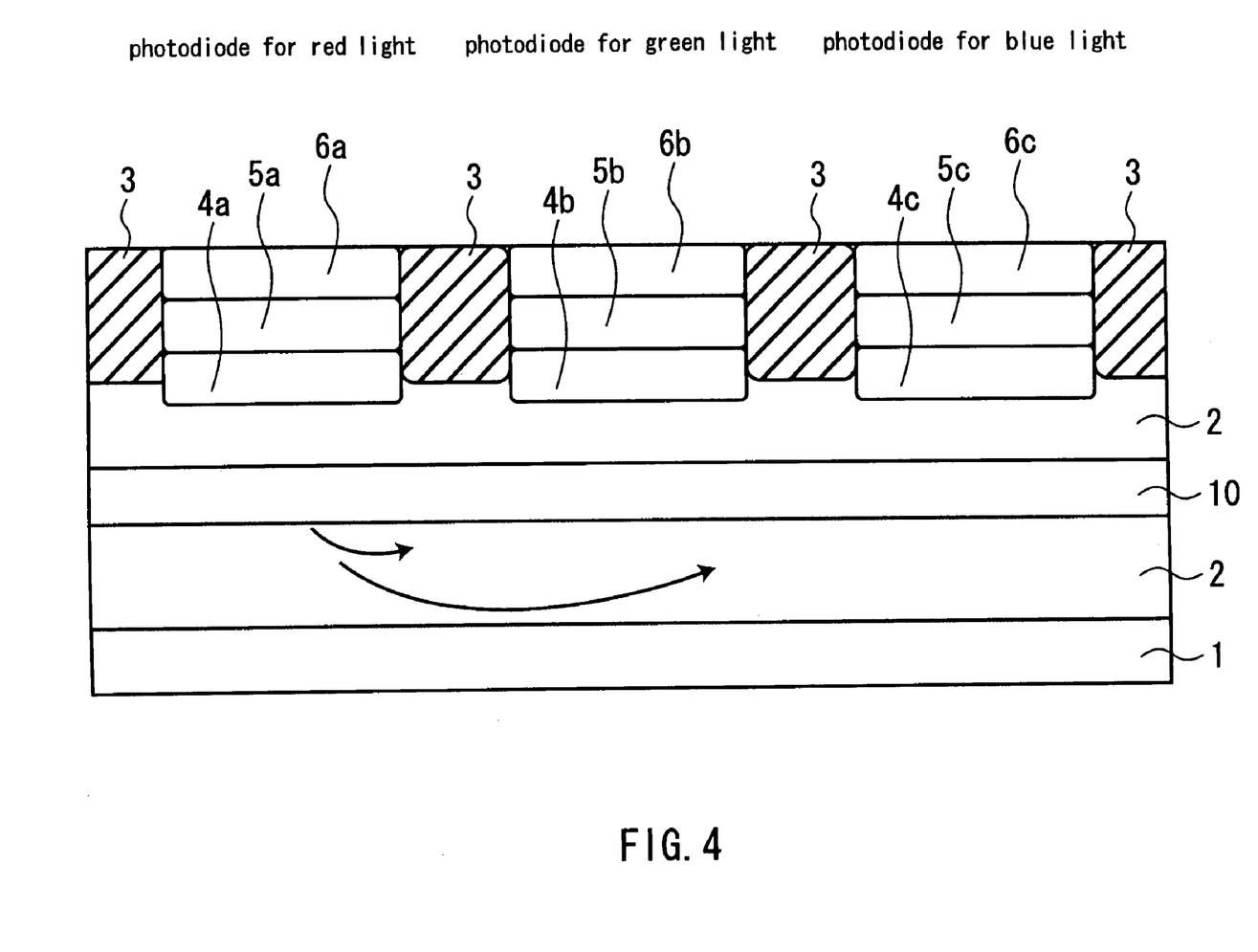
FIG. 4 is a cross-sectional view along an A—A line in FIG. 3(a) and a B—B line in FIG. 3(b).

Next, the color arrangement of a RGB pixel is shown in FIG. 3(a) and 3(b). Moreover, FIG. 4 is a cross-sectional view along an A—A line in FIG. 3(a) and a B—B line in FIG. 3(b), and simplifies and shows the signal accumulation regions and peripheral regions of three adjacent photodiodes.

The isolation region 3 is provided in the P-type well 2 provided in the upper part of the P-type silicon substrate 1. Moreover, first signal accumulation region 5a, second signal accumulation region 5b, and third signal accumulation region 5c are provided in the region separated by the isolation region 3 in the upper part of the P-type well 2. Moreover, the N-type drain regions (not shown) are provided in the surface region of the P-type well 2 with a space from the signal accumulation regions 5a, 5b and 5c. Furthermore, below the signal accumulation regions 5a, 5b and 5c, the P-type barrier regions 4a, 4b and 4c are provided.

Furthermore, the carrier absorption region 10 is provided continuously below the P-type barrier regions 4a, 4b and 4c.

Moreover, first P-type shield region 6a, second P-type shield region 6b and third P-type shield region 6c are provided between the signal accumulation regions 5a, 5b and 5c and the upper surface of the P-type well 2 with a space from each other. These P-type shield regions 6a, 6b and 6c are connected to the isolation region 3. Furthermore, on the P-type well 2, the read-out gate electrodes (not shown) which reads the signal of the signal accumulation regions 5a, 5b and 5c are provided between each N-type drain region and each of the signal accumulation regions 5a, 5b and 5c with a gate insulator layer (not shown) interposed therebetween.

Furthermore, light filters (shown in FIG. 9 as light filters 14R, 14G. 14B) are provided above the P-type well 2. Each of the light filters faces each of the signal accumulation regions 5a, 5b and 5c. Transmitted-wave lengths of the light filters differ mutually. The light filter for red light is provided above first signal accumulation region 5a, the light filter for green light is provided above second signal accumulation region 5b and the light filter for blue light is provided above third signal accumulation region 5c. Thereby, the photodiode for red light is composed of the P-type well 2, first P-type barrier region 4a, first signal accumulation region 5a and first P-type shield region 6a. The photodiode for green light is composed of the P-type well 2, second P-type barrier region 4b, second signal accumulation region 5b, and second P-type shield region 6b. Moreover, the photodiode for blue light is composed of the P-type well 2, third P-type barrier region 4c, third signal accumulation region 5c and third P-type shield region 6c.

Next, with reference to FIGS. 5 and 6, a method of manufacturing the solid state image sensing device according to the embodiment shown in FIG. 1 to 4 will be described. FIGS. 5 and 6 is a cross-sectional view showing the method of manufacturing the solid state image sensing device according to the embodiment.

Figure 5A:
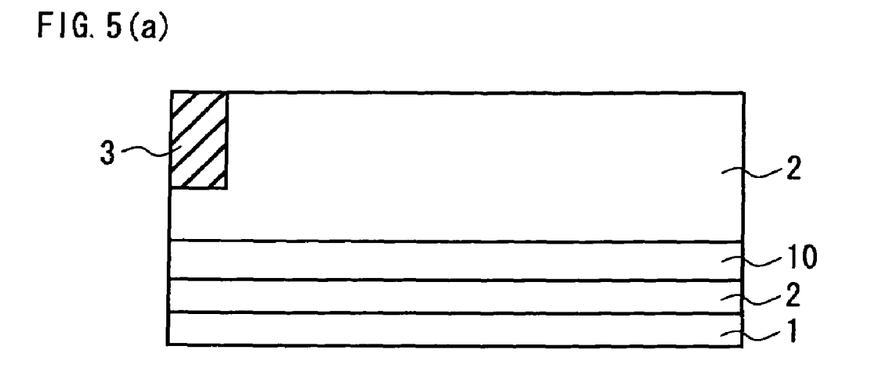
FIG. 5 is a first cross-sectional view showing the method of manufacturing the solid state image sensing device according to the embodiment of the present invention.

First, as shown in FIG. 5(a), the isolation region 3 is formed in the P-type well 2. Then, by carrying out an ion implantation of the N-type impurities, the carrier absorption region 10 is formed in the P-type well 2 with a space from the upper surface of the P-type well 2.

Figure 5B:
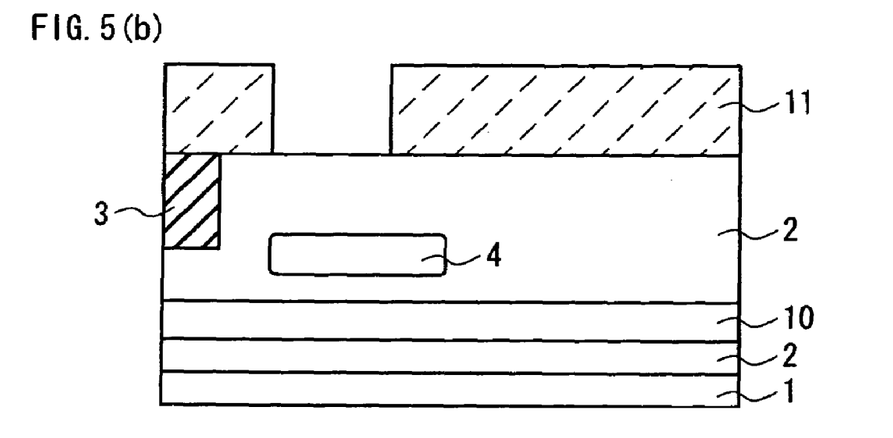

Next, as shown in FIG. 5(b), a first resist 11 is patterned so that a region in which the P-type barrier region 4 is formed is exposed. And by carrying out an ion implantation of the P-type impurities to the P-type well 2 by using the first resist 11 as a mask, the P-type barrier region 4 is formed in the upper part of the P-type well 2 with a space from the upper surface of the P-type well 2.

Figure 5C:
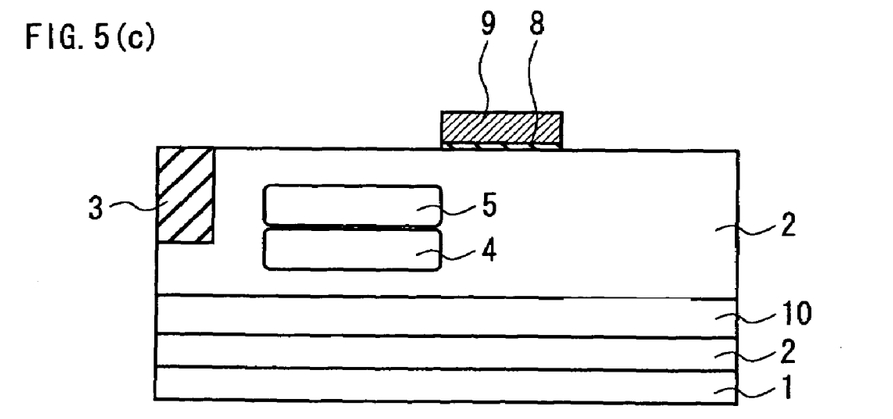

Next, as shown in FIG. 5(c), the N-type signal accumulation region 5 is formed on the P-type barrier region 4 formed in the P-type well 2 by carrying out an ion implantation of the N-type impurities by using the first resist 11 as a mask. Moreover, after removing the first resist 11, the gate insulator layer 8 is formed on the P-type well 2, and the gate electrode 9 of the read-out transistor is formed on the gate insulator layer 8.

Figure 6A:
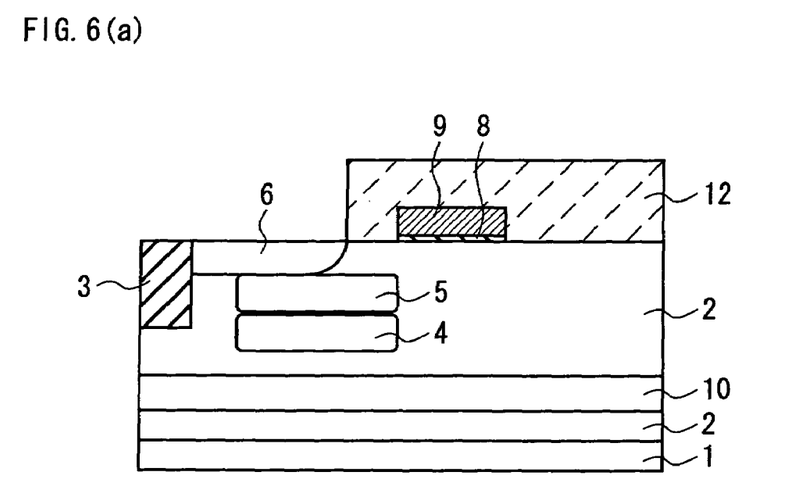
FIG. 6 is a second cross-sectional view showing the method of manufacturing the solid state image sensing device according to the embodiment of the present invention.

Next, as shown in FIG. 6(a), a second resist 12 is patterned so that a side of the read-out gate electrode 9 in which the signal accumulation region 5 is formed is exposed. Then, the P-type shield region 6 is formed between the upper surface of the P-type well 2 and the signal accumulation region 5 by carrying out an ion implantation of the P-type impurities by using the second resist 12 as a mask. The P-type shield region 6 is connected to the isolation region 3. By these process shown in FIGS. 5(a) to 6(a), the photodiode which has the P-type well 2, the P-type barrier region 4, the signal accumulation region 5 and the P-type shield region 6 is formed.

Figure 6B:
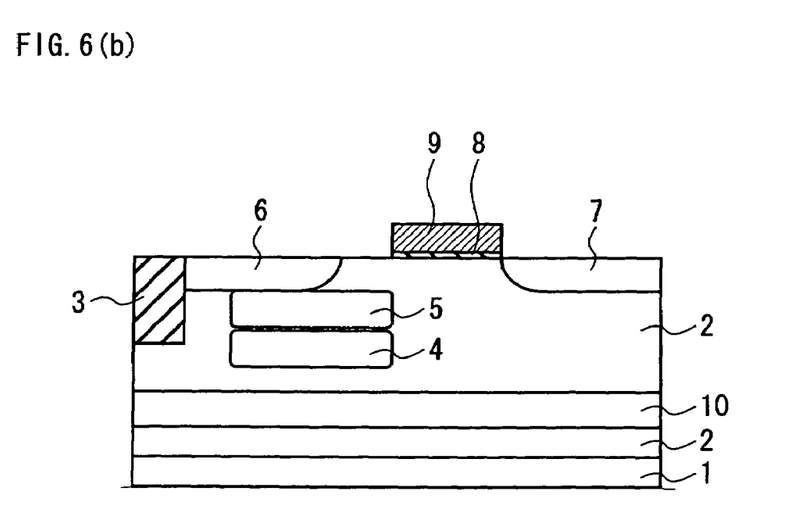

Next, the second resist 12 is removed, and as shown in FIG. 6(b), a third resist (not shown) is patterned so that a side of the read-out gate electrode 9 in which the signal accumulation region 5 is formed is covered. And by carrying out the ion implantation of the N-type impurities to the upper part of the P-type well 2 by using the third resist as a mask, the N-type drain region 7 is formed with a space from the signal accumulation region 5. Then, the third resist is removed.

In the solid state image sensing device described above, the carrier absorption region 10 which has a conductivity type contrary to the conductivity type of the P-type well 2 is provided below the photodiode including the P-type barrier region 4, the signal accumulation region 5 and the P-type shield region 6. Therefore, as an arrow shown in FIG. 4, the signal charge which enter from signal accumulation region 5a of the photodiode for light with long wavelength to the signal accumulation regions 5b and 5c of the adjacent photodiodes can be absorbed in the carrier absorption region 10, and a color mixture and a dark current can be reduced.

Moreover, in the solid state image sensing device according to the embodiment, the N-type drain region 7 is provided at a shallower position than the signal accumulation region 5. Therefore signal charge cannot enter easily from the signal accumulation region of the photodiode for colors with long wavelength (for example, photodiode for red etc.) to the signal accumulation region of the adjacent photodiode.

Figure 7:
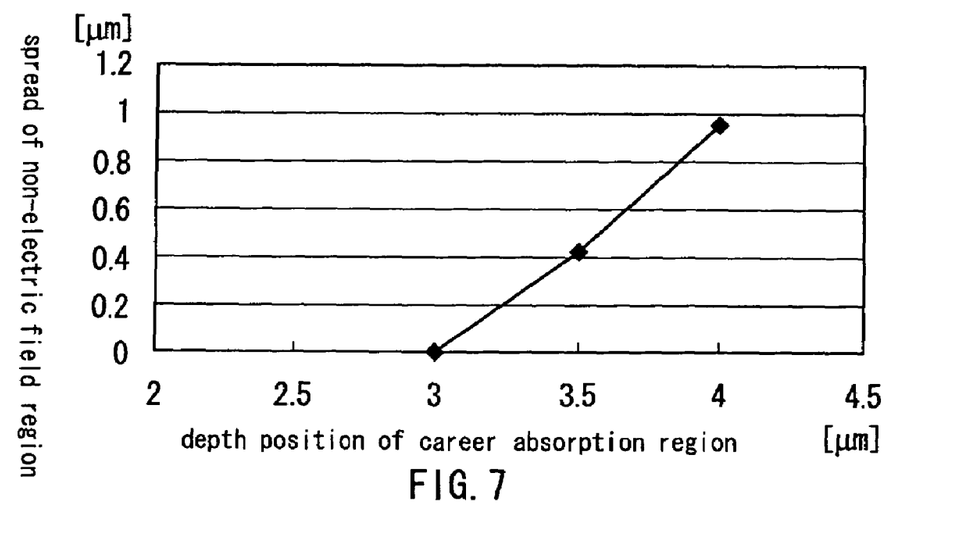
FIG. 7 is a profile showing a simulation result about a relation between a depth position of a carrier absorption region and a spread of a non-electric field region.

In addition, it is desirable that a depth position of the carrier absorption region 10 is 3 micrometers or less from the upper surface of the P-type well 2. A simulation result about a relation between the depth position of the carrier absorption region 10 and a spread of a non-electric field region is shown in FIG. 7. In FIG. 7, a horizontal axis shows the depth position of the carrier absorption region 10, i.e. a distance from the upper surface of the P-type well 2 to the upper surface of the carrier absorption region 10. Moreover, a vertical axis shows the spread of the non-electric field region, i.e. a spread of a region without a slope of the electric field between the P-type shield region 6 and the carrier absorption region 10. The simulation is performed, setting impurity concentration of the P-type well 2 to $2\times10^{15}$ cm$^{-3}$, and setting impurity concentration of the carrier absorption region 10 to $2\times10^{17}$ cm$^{-3}$. As shown in FIG. 7, a non-electric field region can be lost by setting a distance from the upper surface of the P-type well 2 to the upper surface of the carrier absorption region 10 to 3 micrometers or less.

Figure 8A:
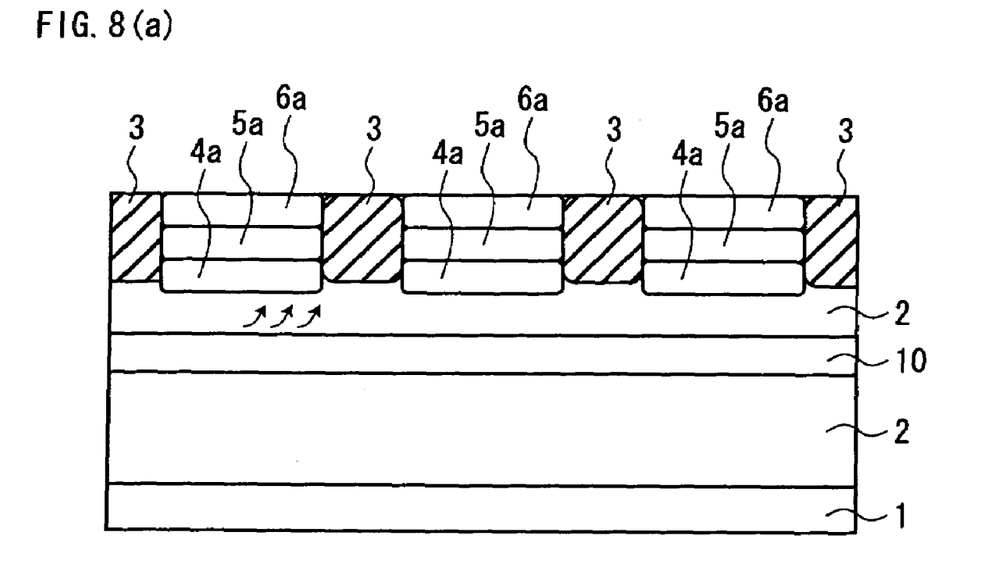
FIG. 8 is a cross-sectional view showing a flow of signal charge in the solid state image sensing device shown in FIG. 4.
Figure 8B:
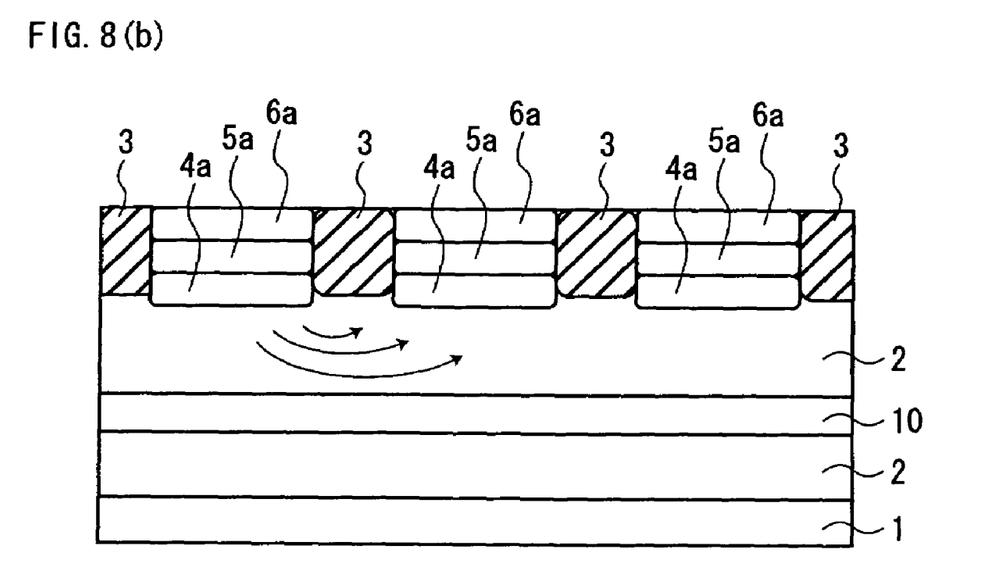

FIG. 8 shows a flow of the signal charge in the solid state image sensing device shown in FIG. 4. FIG. 8(a) shows a case where a depth position of the carrier absorption region 10 is 3 micrometers or less from the upper surface of the P-type well 2. FIG. 8(b) shows a case where a depth position of the carrier absorption region 10 is 3 micrometers or more from the upper surface of the P-type well 2. Since a non-electric field region exists between the P-type shield region 6 and the carrier absorption region 10 in the case where the depth position of the carrier absorption region 10 is 3 micrometers or more from the upper surface of the P-type well 2, as shown in an arrow of FIG. 8(b), signal charge generated between the P-type shield region 6 and the carrier absorption region 10 flow to an adjacent photodiode, and a problem of a color mixture arises. On the other hand, in a case where the depth position of the carrier absorption region 10 is 3 micrometers or less from the upper surface of the P-type well 2, as shown in the arrow of FIG. 8(a), signal charge flow to the upper surface of the P-type well 2, and it is absorbed by the nearest photodiode from a position in which the signal charge is generated according to the slope of the electric field between the P-type shield region 6 and the carrier absorption region 10. Thus, if the depth position of the carrier absorption region 10 is set to 3 micrometers or less from the upper surface of the P-type well 2, a color mixture can be prevented more effectively.

Figure 9:
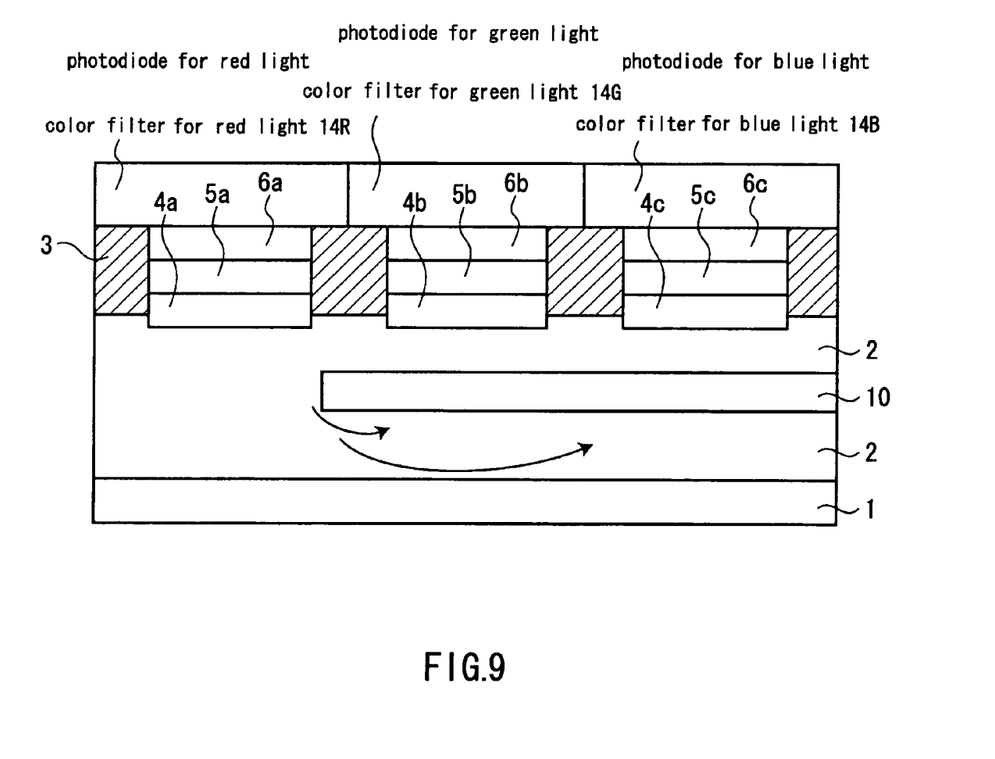
FIG. 9 is a schematic diagram showing a cross-sectional structure of adjacent three unit cells of the solid state image sensing device according to the modification of the embodiment of the present invention.

Then, with reference to FIG. 9, the solid state image sensing device according to a modification of the embodiment will be described. FIG. 9 is a schematic diagram showing a cross-sectional structure of adjacent three unit cells of the solid state image sensing device with light filters 14R, 14G, 14B according to the modification. FIG. 9 is a drawing corresponding to FIG. 4.

The carrier absorption region 10 is provided continuously below the signal accumulation regions other than that of the photodiode for red light, i.e. the second and third signal accumulation region 5b and 5c. In other word, the carrier absorption region 10 is not formed below the signal accumulation region of the photodiode for red light, i.e. third P-type signal accumulation region 5a, but formed selectively below the signal accumulation region of the photodiode other than that for red light. That is, the carrier absorption region 10 is provided continuously in unit cells other than the unit cell in which the light filter with the longest transmitted-wave length is provided, and the carrier absorption region 10 is not provided below a P-type barrier region in the unit cell in which the light filter with the longest transmitted-wave length is provided. In addition, the solid state image sensing device according to the modification of the embodiment can be manufactured by patterning a resist so that the resist covers the unit cells in which the light filters with the longest transmitted-wave length is formed and carrying out an ion implantation by using the resist as a mask in the process which forms the carrier absorption region 10 shown in FIG. 5(a).

Generally, absorption of light with a semiconductor changes with wavelength of light. The photoelectric conversion of the light with short wavelength (for example, blue light etc.) is carried out near the surface of the P-type well 2. On the other hand, the light with long wavelength (for example, red light etc.) travels to deep position of the P-type well 2, and the photoelectric conversion is carried out at the deep position. Therefore, in a case where the carrier absorption region 10 is provided below the signal accumulation region of the photodiode for colors with long wavelength, the signal charge generated by the photoelectric conversion is accumulated in the carrier absorption region 10 instead of a signal accumulation region, and the sensitivity of the photodiode may fall. However, in the solid state image sensing device shown in FIG. 9, the carrier absorption region 10 is not provided below the signal accumulation region 5a of the photodiode for red light. Therefore, the solid state image sensing device according to the modification of the embodiment can reduce a color mixture and a dark current without a loss of a sensitivity of the unit cell in which the photodiode for colors with long wavelength is provided.

In addition, in the solid state image sensing device according to the embodiment, a P-type silicon substrate is described as an example of a semiconductor substrate. However the semiconductor substrate is not limited to the P-type silicon substrate. For example, the same effect as the embodiment can be acquired by making the conductivity type of each semiconductor region reverse if a semiconductor substrate is an N-type silicon substrate.

Moreover, in the solid state image sensing device according to the embodiment, a case where the P-type well 2 is formed in the P-type silicon substrate 1 and the N-type signal accumulation region 5 is formed in the P-type well 2 was described. However the invention is not limited to this case. For example, the N-type signal accumulation region 5 may be formed in the upper part of the P-type silicon substrate 1 by considering the P-type silicon substrate 1 to be the first semiconductor region.

Furthermore, in the solid state image sensing device according to the embodiment, a case where the color arrangement of a pixel was RGB color arrangement was described. However the invention is not limited to this case. For example, the color arrangement of a pixel may be CMYG color arrangement (Cyan, Magenta, Yellow, Green). In a case where the CMYG color arrangement is applied to the solid state image sensing device according to the modification of the embodiment, what is necessary is to provide a carrier absorption region below a signal accumulation region in a photodiode other than the photodiode for magenta light. In other word, regardless of a color arrangement of pixels, a carrier absorption region may be formed below a signal accumulation region in unit cells other than the unit cell in which a light filter with a longest transmitted-wave length is provided among unit cells in which two or more kinds of light filters with transmitted-wave lengths which differ mutually are provided.

Furthermore, in the method of manufacturing the solid state image sensing device according to the embodiment, a case where the resist 11 is formed and the ion implantation is carried out by using the resist 11 as a mask in forming the N-type signal accumulation region 5 was described. However the invention is not limited to this case. For example, the signal accumulation region 5 may be formed with self-aligned to the read-out gate electrode 9.

Furthermore, in the method of manufacturing the solid state image sensing device according to the embodiment, the P-type barrier region 4 is formed, then the signal accumulation region 5 and the P-type shield region 6 are formed. However an order which forms these semiconductor regions is not limited to this order. When an order of these processes is replaced, a same effect as the embodiment can be acquired.

The present invention can be variously modified within the scope thereof in a practical phase.

What is claimed is:

1. A solid state image sensing device comprising:
    a first semiconductor region of first conductivity type;
    a photodiode provided in the first semiconductor region, the photodiode configured to convert light into charge and accumulate the charge, the photodiode including a second semiconductor region of second conductivity type provided in the first semiconductor region;
    a third semiconductor region of second conductivity type provided in the first semiconductor region with a space from the second semiconductor region;
    a gate electrode provided on the first semiconductor region between the photodiode and the third semiconductor region;
    a gate insulator layer interposed between the first semiconductor region and the gate electrode;
    a fourth semiconductor region of second conductivity type provided below the second semiconductor region in the first semiconductor region; and
    a fifth semiconductor region of first conductivity type with impurity concentration higher than that of the first semiconductor region provided between the second semiconductor region and the fourth semiconductor region in the first semiconductor regions, the fifth semiconductor region provided directly under the second semiconductor region.

2. The solid state image sensing device according to claim 1, further comprising:
a sixth semiconductor region of first conductivity type provided between an upper surface of the first semiconductor region and the second semiconductor region in the first semiconductor region.

3. The solid state image sensing device according to claim 2, further comprising:
an isolation region provided in the first semiconductor region, wherein the sixth semiconductor region is connected with the isolation region to be grounded.

4. The solid state image sensing device according to claim 1, wherein a depth position of the fourth semiconductor region is 3 micrometers or less from the upper surface of the semiconductor region.

5. A solid state image sensing device comprising:
a plurality of unit cells, each of the unit cells including a first semiconductor region of first conductivity type, a photodiode provided in the first semiconductor region, the photodiode configured to convert light into charge and accumulate the charge, the photodiode including a second semiconductor region of second conductivity type provided in the first semiconductor region, a third semiconductor region of second conductivity type provided in the first semiconductor region with a space from the second semiconductor region, a gate electrode provided on the first semiconductor region between the second semiconductor region and the third semiconductor region, and a gate insulator layer interposed between the first semiconductor region and the gate electrode;
a plurality of light filters constituted by two or more kinds of light filters with transmitted wavelengths which differ mutually, each of the light filters provided above the first semiconductor region and facing the second semiconductor region in each of the unit cells; and
a fourth semiconductor region of second conductivity type provided below the second semiconductor region in the unit cell other than the unit cell in which the light filter with the longest transmitted-wave length is provided, wherein
each of the unit cells further includes a fifth semiconductor region of first conductivity type with impurity concentration higher than that of the first semiconductor region provided between the second semiconductor region and the fourth semiconductor region in the first semiconductor region, the fifth semiconductor region provided directly under the second semiconductor region.

6. The solid state image sensing device according to claim 5, wherein each of the unit cells further includes a sixth semiconductor region of first conductivity type provided between an upper surface of the first semiconductor region and the second semiconductor region in the first semiconductor region.

7. The solid state image sensing device according to claim 6, wherein each of the unit cells further includes an isolation region provided in the first semiconductor region, wherein the sixth semiconductor region is connected with the isolation region to be grounded.

8. The solid state image sensing device according to claim 5, wherein the fourth semiconductor region is provided continuously in the plurality of unit cells other than the unit cell in which the light filter with the longest transmitted-wave length is provided.

9. The solid state image sensing device according to claim 5, wherein a depth position of the fourth semiconductor region is 3 micrometers or less from the upper surface of the first semiconductor region.

10. The solid state image sensing device according to claim 5, wherein a color arrangement of the color filters is RGB color arrangement.

11. The solid state image sensing device according to claim 5, wherein a color arrangement of the color filters is CMYG color arrangement.

* * * * *